(12) United States Patent
Okada (10) Patent No.: US 6,801,062 B2
(45) Date of Patent: Oct. 5, 2004

(54) OUTPUT CIRCUIT

(75) Inventor: Yasuyuki Okada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/345,940

(22) Filed: Jan. 17, 2003

(65) Prior Publication Data

US 2003/0137326 A1 Jul. 24, 2003

(30) Foreign Application Priority Data

Jan. 24, 2002 (JP) ........................................ 2002-015118

(51) Int. Cl.[7] .............................................. H03K 3/00
(52) U.S. Cl. .......................... 327/108; 327/112; 326/87
(58) Field of Search ........................ 327/108–112, 170, 327/436, 437; 326/85, 87

(56) References Cited

U.S. PATENT DOCUMENTS 6,300,806 B1 * 10/2001 Theus et al. ................. 327/112
2001/0017554 A1    8/2001 Tsuji ............................. 327/112

FOREIGN PATENT DOCUMENTS

| JP | 4-145715 | 5/1992 |
| JP | 4-145717 | 5/1992 |
| JP | 9-232930 | 9/1997 |

* cited by examiner

*Primary Examiner*—Kenneth B. Wells
(74) *Attorney, Agent, or Firm*—McDermott Will & Emery LLP (57) ABSTRACT

In a first and second logic circuit controlling a driver circuit of CMOS configuration having a plurality of output transistors connected in parallel, a delay fluctuation clock signal and a delay fluctuation data signal are generated by generating multi-phase data signals from multi-phase clock signals that each have a different phase difference with respect to a reference clock signal, and using a delay circuit having a variable delay time reflecting the change of the current driving capability of the output transistors in the driver circuit. Then, changes in the current driving capability of the output transistors are detected from a phase relation between the multi-phase data signals and the delay fluctuation data signal, and if it is detected that the current driving capability has decreased, then the number of output transistors that become conducting is increased, whereas if it is detected that the current driving capability has increased, then their number is decreased.

9 Claims, 8 Drawing Sheets

OUTPUT CIRCUIT

BACKGROUND OF THE INVENTION

The present invention relates to output circuits in semiconductor integrated circuits.

JP H4-145717A discloses an output circuit including a driver circuit of CMOS configuration. In order to obtain a large current driving capability, this driver circuit includes a plurality of N-channel output transistors that are connected in parallel to one another and a plurality of P-channel output transistors that are connected also in parallel to one another. The times when a peak current flows through the output transistors are offset by controlling the gate voltages of the output transistors with a delay circuit such that the N-channel output transistors do not change the off-state simultaneously to the on-state, and such that the P-channel output transistors do not change the off-state simultaneously to the on-state, thereby suppressing noise at the time of data output. However, since analog means are used for the conduction timing adjustment of the output transistors, it is not possible to accommodate design changes smoothly, and furthermore the effect of noise suppression depends on the manufacturing process.

In order to address these problems, the output circuit in JP H9-232930A uses a digital circuit (made of a shift register and a multiplexer) receiving a single clock signal of variable period to adjust the conduction timing of the output transistors in a CMOS driver circuit similar to the one mentioned above.

Now, if a small-amplitude high-speed interface of, for example, SSTL (stub series terminated logic) or HSTL (high speed transceiver logic) is included in an LSI circuit, then the drain terminals of all output transistors in a CMOS driver circuit like the one described above are internally connected to a common output pad, the source terminals of the N-channel output transistors are internally connected to a common ground voltage VSSQ and the source terminals of the P-channel output transistors are internally connected to a common power source voltage VDDQ, and the output pad is connected via a terminating resistance outside the LSI circuit to a terminating voltage VTT. Ordinarily, VTT is set such that $$VTT = (VDDQ + VSSQ)/2$$

is fulfilled. Therefore, in addition to a charge/discharge current at the time of data transition that is specific to the CMOS driver circuit, a stationary output current flows between VTT and VSSQ when the N-channel output transistors become conducting and the output pad indicates a LOW voltage, and a stationary output current flows between VDDQ and VTT when the P-channel output transistors become conducting and the output pad indicates a HIGH voltage. The current driving capability of the output transistors fluctuates due to variations in the manufacturing process, or in response to changes in the power source voltage or in the temperature, so that also the output current of the driver circuit fluctuates.

Usually, the size of the output transistors is designed so as to satisfy certain specifications, such as the output current, under worst-case conditions with regard to the manufacturing process and power source voltage and temperature, that is, the conditions at which the output transistors have the lowest current driving capability. Consequently, conventionally, under the best-case conditions, under which the output transistors have the highest current driving capability, the output current of the driver circuit may become excessive, and may even reach twice the output current for the worst-case conditions. This, however, leads to an increase in power consumption of the LSI circuit.

SUMMARY OF THE INVENTION

It is thus an object of the present invention to make it possible to obtain from a driver circuit a substantially constant output current, even when there are variations in the manufacturing process or fluctuations in the power source voltage or the temperature.

In order to achieve this object, an output circuit in accordance with the present invention includes a driver circuit having a plurality of output transistors that are connected to one another in parallel, and a control circuit controlling this driver circuit such that when a given data signal indicates a predetermined logic level, at least one of the plurality of output transistors becomes conducting, wherein the control circuit comprises a delay circuit with a variable delay time that reflects a change of a current driving capability of the plurality of output transistors, wherein, when it is detected from a change of the delay time that the current driving capability of the individual output transistors has decreased, then the number of the output transistors that become conducting is increased, and wherein, when it is detected from a change of the delay time that the current driving capability of the individual output transistors has increased, then the number of the output transistors that become conducting is decreased.

In accordance with the present invention, it is possible to generate a delay fluctuation signal having a variable phase difference reflecting the delay time to, for example, a reference clock signal, by using a delay circuit having a variable delay time that reflects changes in the current driving capability of the output transistors. Then, by determining the phase relation between multi-phase signals each having a different phase difference with respect to the reference clock signal and the generated delay fluctuation signal, it is possible to detect changes in the current driving capability of the output transistors from that relation.

DETAILED DESCRIPTION OF THE INVENTION

Referring to the accompanying drawings, the following is a description of an embodiment of an output circuit in an LSI circuit. This output circuit is suitable to realize a small-amplitude and high-speed interface.

Figure 1:
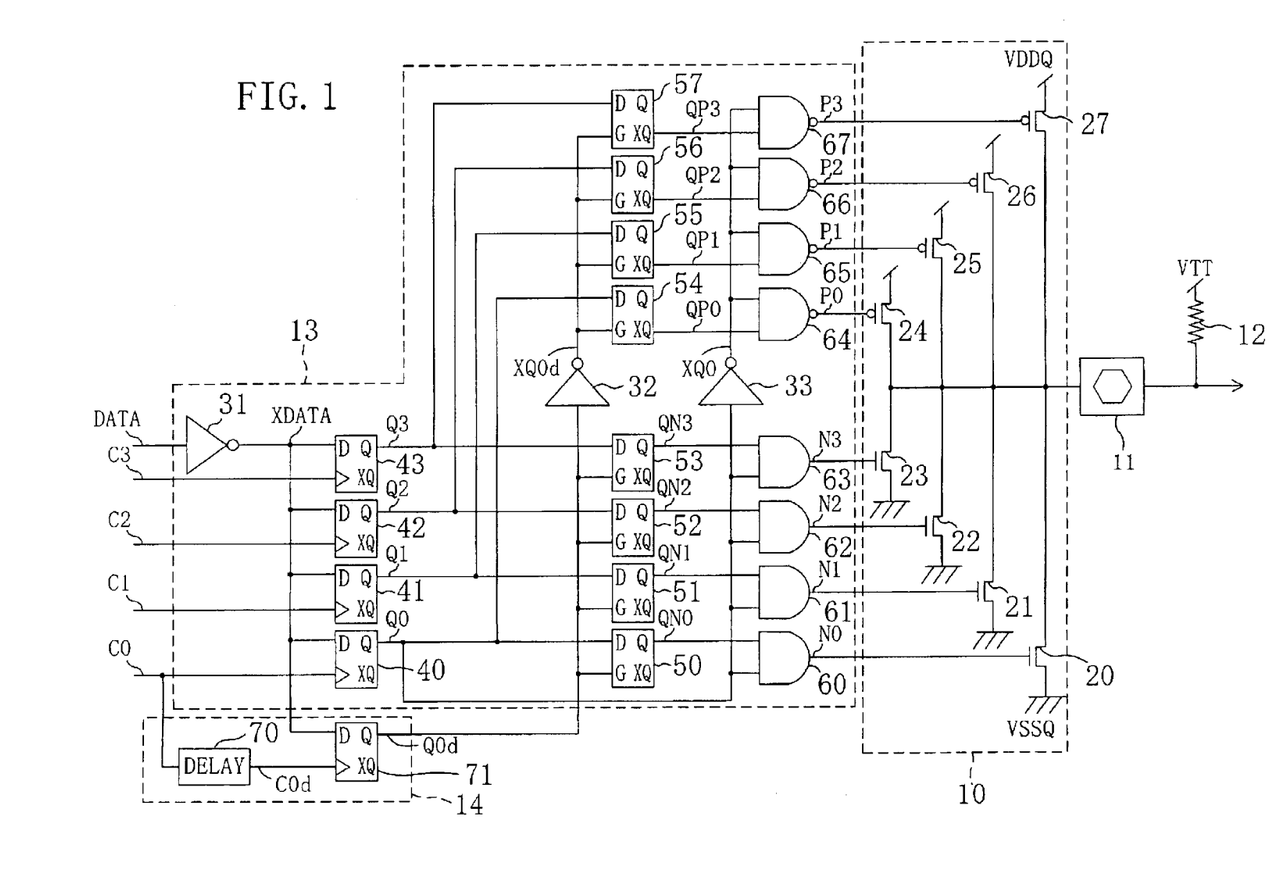
FIG. 1 is a block diagram showing a configuration example of an output circuit in accordance with the present invention.

FIG. 1 shows a configuration example of an output circuit in accordance with the present invention. The output circuit of FIG. 1 includes a driver circuit 10 of CMOS configuration. This driver circuit 10 includes four N-channel output transistors 20, 21, 22 and 23 that are arranged parallel to one another, and four P-channel output transistors 24, 25, 26 and 27 also arranged parallel to one another. The drain terminals of all output transistors 20 to 27 are internally connected to a common output pad 11, the source terminals of the N-channel output transistors 20 to 23 are internally connected to a common ground voltage VSSQ (of, for example, 0V), and the source terminals of the P-channel output transistors 24 to 27 are internally connected to a common power source voltage VDDQ (of, for example, 2.5V or 1.5V). Outside the LSI circuit, the output pad 11 is connected via a terminating resistance 12 to a terminating voltage VTT. VTT is set such that $$VTT=(VDDQ+VSSQ)/2$$

is fulfilled. Therefore, a stationary output current flows between VTT and VSSQ when any of the N-channel output transistors 20 to 23 is conducting and the output pad 11 indicates a LOW voltage, or between VDDQ and VTT when any of the P-channel output transistors 24 to 27 is conducting and the output pad 11 indicates a HIGH voltage. The current driving capability of the output transistors 20 to 27 fluctuates due to variations in the manufacturing process, or in response to changes in the power source voltage or in the temperature. With the present invention, a substantially constant output current can be attained from the driver circuit 10 even when there are such fluctuations in the current driving capability.

The output circuit of FIG. 1 further includes a first logic circuit 13 and a second logic circuit 14. In the first logic circuit 13, numerals 31, 32 and 33 denote first, second and third inverters, numerals 40, 41, 42 and 43 denote D flip-flops as known in the art, numerals 50, 51, 52, 53, 54, 55, 56 and 57 denote data latch circuits, numerals 60, 61, 62 and 63 denote AND circuits, and numerals 64, 65, 66 and 67 denote NAND circuits. In the second logic circuit 14, numeral 70 denotes a delay circuit, and numeral 71 denotes a D flip-flop as known in the art.

The control circuit made of the first and second logic circuits 13 and 14 receives a data signal (DATA) and four clock signals C0, C1, C2 and C3. The first inverter 31 supplies a signal XDATA obtained by inverting the DATA signal. The D flip-flops 40, 41, 42 and 43 receive the signal DATA at their D terminals and the signals C0, C1, C2 and C3 at their respective clock terminals, and supply the four-phase data signals Q0, Q1, Q2 and Q3 from their Q terminals. The delay circuit 70 delays C0 by the variable delay time Td and supplies the resulting delay fluctuation clock signal C0d. The D flip-flop 71 receives XDATA at its D terminal and C0d at its clock terminal, and supplies a delay fluctuation data signal Q0d from its Q terminal. The data latch circuits 50, 51, 52 and 53 receive Q0d at their respective G terminals, receive Q0, Q1, Q2 and Q3 at their respective D terminals, and supply latch signals QN0, QN1, QN2 and QN3 from their respective Q terminals. The AND circuits 60, 61, 62 and 63 receive Q0 as one input and QN0, QN1, QN2 and QN3, respectively, as the other input, and supply respective gate voltage signals N0, N1, N2 and N3. The N-channel transistors 20, 21, 22 and 23 in the driver circuit 10 receive N0, N1, N2 and N3 at their respective gate terminals. The second inverter 32 supplies a signal XQ0d that is obtained by inverting Q0d, and the third inverter 33 supplies a signal XQ0 that is obtained by inverting Q0. The data latch circuits 54, 55, 56 and 57 receive XQ0d at their respective G terminals, receive Q0, Q1, Q2 and Q3 at their respective D terminals, and supply the latch signals QP0, QP1, QP2 and QP3 from their respective XQ terminals. The NAND circuits 64, 65, 66 and 67 receive XQ0 as one input and QP0, QP1, QP2 and QP3, respectively, as the other input, and supply respective gate voltage signals P0, P1, P2 and P3. The P-channel output transistors 24, 25, 26 and 27 in the driver circuit 10 receive P0, P1, P2 and P3 at their respective gate terminals.

Figure 2:
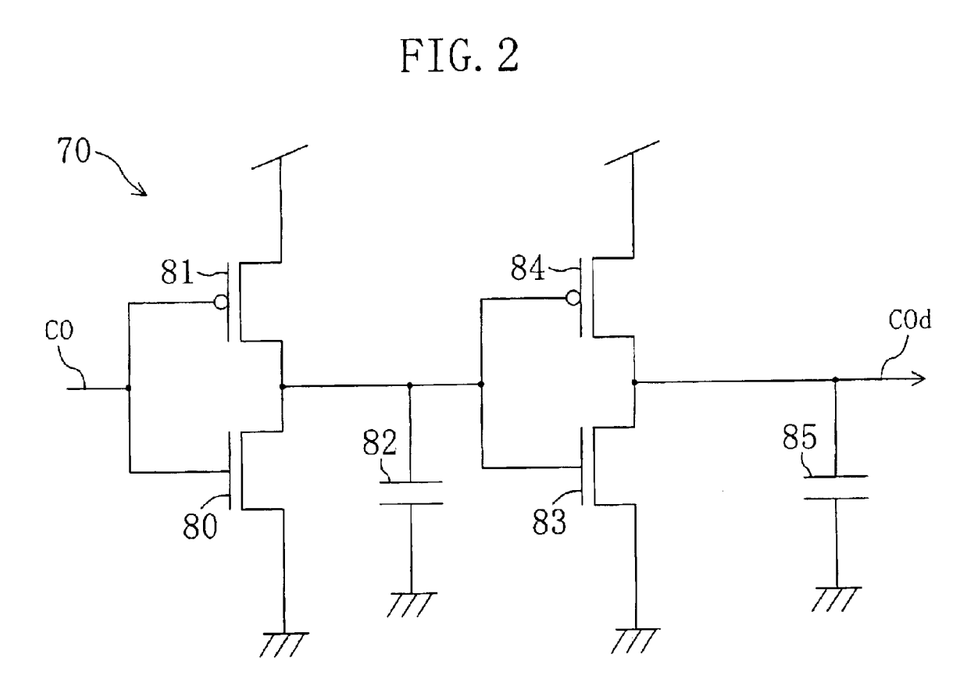
FIG. 2 is a circuit diagram showing an example of the internal configuration of the delay circuit in FIG. 1.

FIG. 2 shows an example of the internal configuration of the delay circuit 70 in FIG. 1. This delay circuit 70 includes a first-stage inverter made of an N-channel transistor 80 and a P-channel transistor 81, a capacitor 82 connected to the output of the first-stage inverter, a second-stage inverter made of an N-channel transistor 83 and a P-channel transistor 84, and a capacitor 85 connected to the output of the second-stage inverter. These four transistors 80, 81, 83 and 84 have the same characteristics as the output transistors 20 to 27 in FIG. 1. Consequently, the delay time Td of C0d with respect to C0 reflects changes in the current driving capability of the output transistors 20 to 27 in FIG. 1. More specifically, Td becomes longer as the current driving capability of the output transistors 20 to 27 decreases, and becomes shorter as the current driving capability of the output transistors 20 to 27 increases. It should be noted that it is possible to realize the capacitors 82 and 85 simply by the parasitic capacitance of wiring or the gate capacitance of a MOS transistor.

Figure 3:
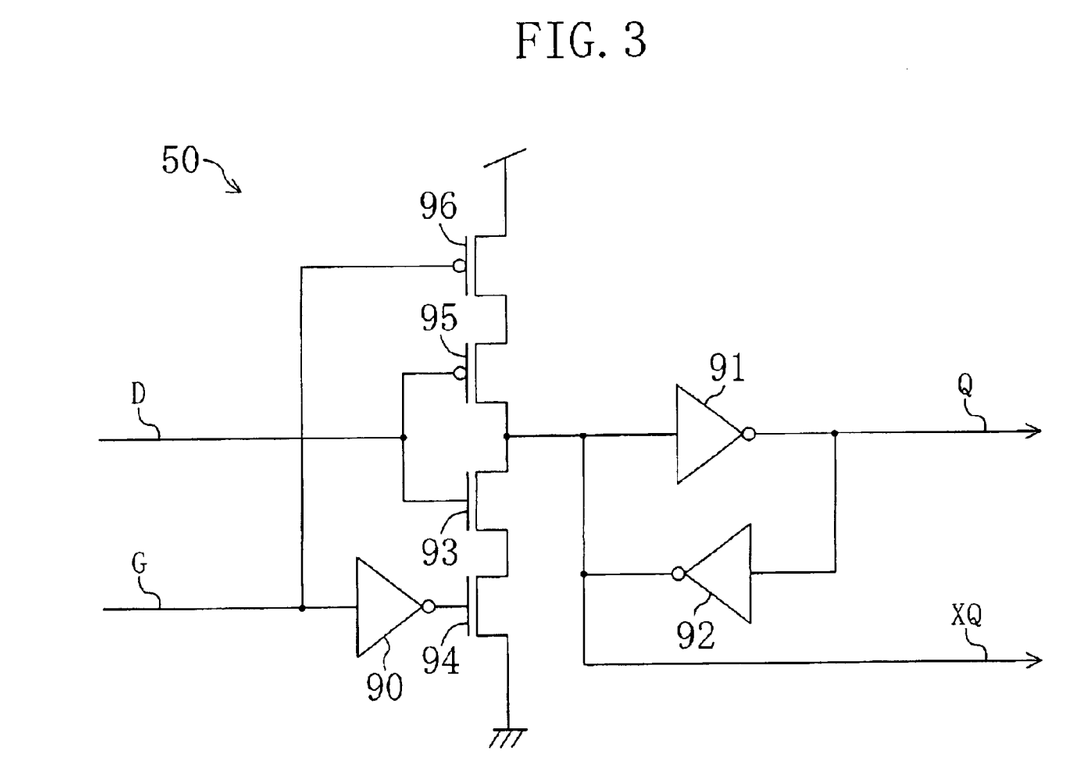
FIG. 3 is a circuit diagram showing an example of the internal configuration of the data latch circuits in FIG. 1.

FIG. 3 shows an example of the internal configuration of the data latch circuit 50 in FIG. 1. This data latch circuit 50 includes a first, a second and a third inverter 90, 91 and 92, a first and a second N-channel transistor 93 and 94, and a first and a second P-channel transistor 95 and 96. The input into the second inverter 91 is connected to the ground voltage via the two N-channel transistors 93 and 94, which are connected to one another in series, and to the power source voltage via the two P-channel transistors 95 and 96, which are also connected to one another in series. The D terminal of the data latch circuit 50 is connected directly to the gate terminals of the first N-channel transistor 93 and the first P-channel transistor 95. Furthermore, the G terminal of the data latch circuit 50 is connected to the gate terminal of the second N-channel transistor 94 via the first inverter 90, and is directly connected to the gate terminal of the second P-channel transistor 96. The output of the second inverter 91 is connected to the Q terminal of the data latch circuit 50, and is also connected to the input of the third inverter 92. The output of the third inverter 92 is connected to the XQ terminal of the data latch circuit 50, and is also connected to the input of the second inverter 91. With the data latch circuit 50 having this internal configuration, when the G terminal input is LOW, the second N-channel transistor 94 and the second P-channel transistor 96 both become conducting (on), so that a signal with the same logic level as the D terminal input appears at the Q terminal and a signal with the opposite logic level from the D terminal input appears at the XQ terminal. Then, when the G terminal input changes its state from LOW to HIGH, the second N-channel transistor 94 and the second P-channel transistor 96 both become non-conducting (off), so that the output of the Q terminal and the output of the XQ terminal at the time of this transition are both held. It should be noted that the internal configuration of the other data latch circuits 51 to 57 in FIG. 1 are the same as that shown in FIG. 3.

Figure 4:
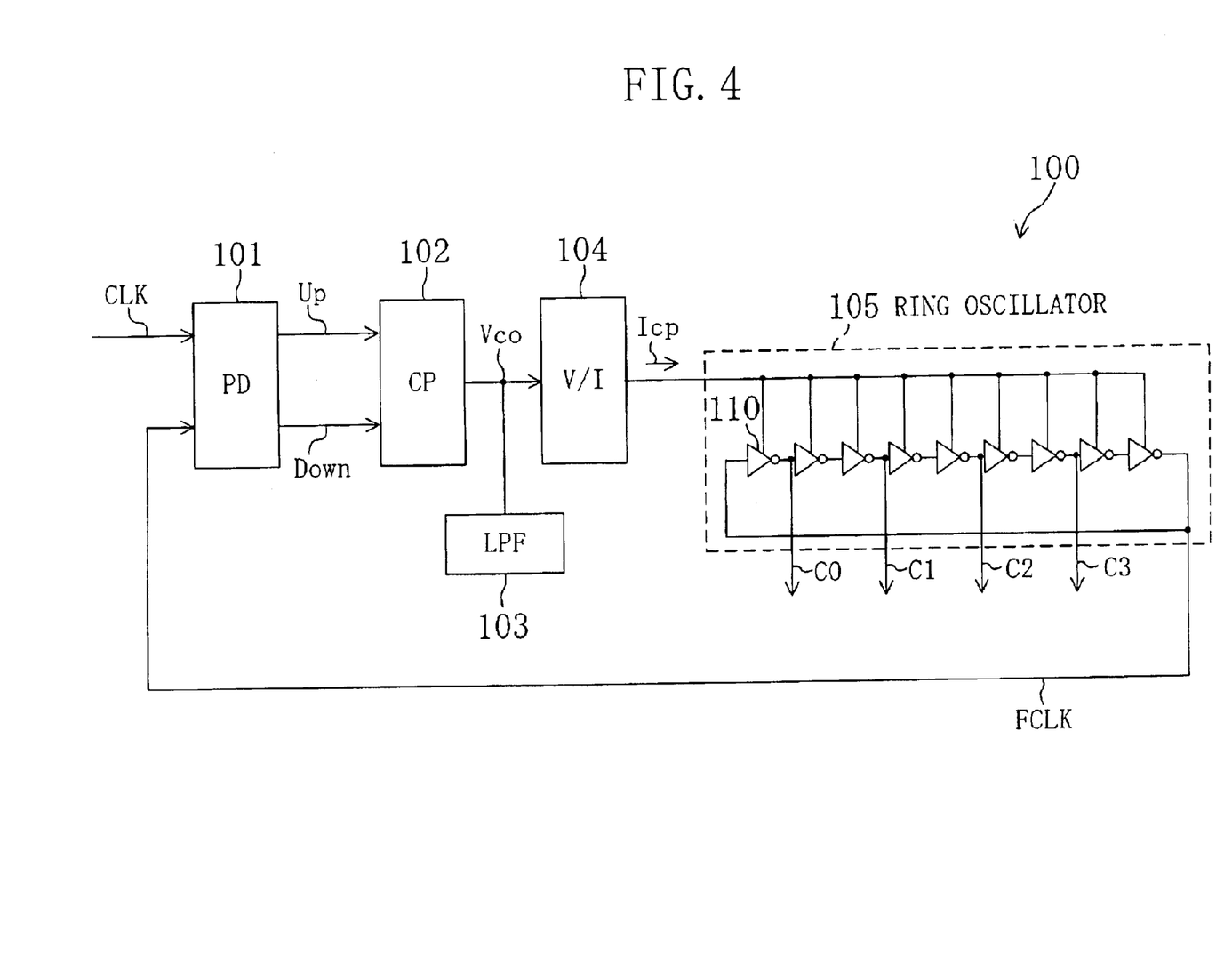
FIG. 4 is a block diagram showing a configuration example of the PLL circuit for supplying the four-phase clock signals to the output circuit in FIG. 1.
Figure 5:
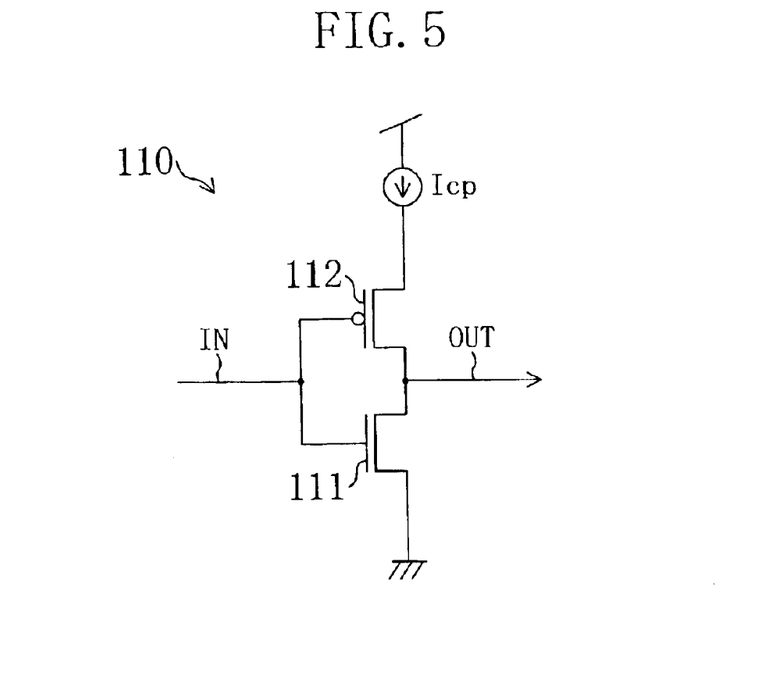
FIG. 5 is a circuit diagram showing an example of the internal configuration of the nine inverters constituting the ring oscillator in FIG. 4.

FIG. 4 shows an example of the configuration of a PLL (phased locked loop) circuit for supplying C0, C1, C2 and C3 to the output circuit of FIG. 1. The PLL circuit 100 in FIG. 4 includes a phase detecting circuit (PD) 101, a charge pump (CP) 102, a low pass filter (LPF) 103, a voltage/current converter (V/I) 104, and a ring oscillator 105. FIG. 5 shows how the nine inverters 110 constituting the ring oscillator 105 in FIG. 4 are each constituted by one N-channel transistor 111 and one P-channel transistor 112.

The phase detecting circuit 101 in FIG. 4 compares the phases of a reference clock (CLK) signal and a feedback clock (FCLK) signal supplied from the ring oscillator 105, and when the CLK is leading FCLK, then the phase detecting circuit 101 transmits an UP signal to the charge pump 102, whereas when the CLK is trailing FCLK, then the phase detecting circuit 101 transmits a DOWN signal to the charge pump 102. The charge pump 102 charges the Vco node in response to the UP signal, and discharges the Vco node in response to the DOWN signal. The Vco node is connected to a low pass filter 103, so that the voltage of the Vco node is turned into an analog voltage from which steep changes have been removed. Then, the voltage/current converter 104 converts a voltage at the Vco node into a corresponding current Icp, and supplies this current Icp to the inverters 110 of the ring oscillator 105. As a result, the oscillation frequency of the ring oscillator 105 becomes higher as Icp increases and becomes lower as Icp decreases. With a PLL circuit 100 having this configuration, CLK and FCLK are kept at the same phase. Then, the output of the four inverters in the ring oscillator 105 is retrieved as the four-phase clock signals C0, C1, C2 and C3 that each have a different phase difference with respect to CLK. Consequently, the phase differences of C0, C1, C2 and C3 to CLK do not depend on variations in the manufacturing process or fluctuations in the power source voltage or the temperature, and are thus substantially constant.

Now, the basic function of the control circuit made of the first and second logic circuits 13 and 14 in FIG. 1 is to control the driver circuit 10 such that when the given DATA signal is LOW, at least one of the four N-channel output transistors 20 to 23 becomes conducting, and when the DATA signal is HIGH, at least one of the four P-channel output transistors 24 to 27 becomes conducting.

Figure 6:
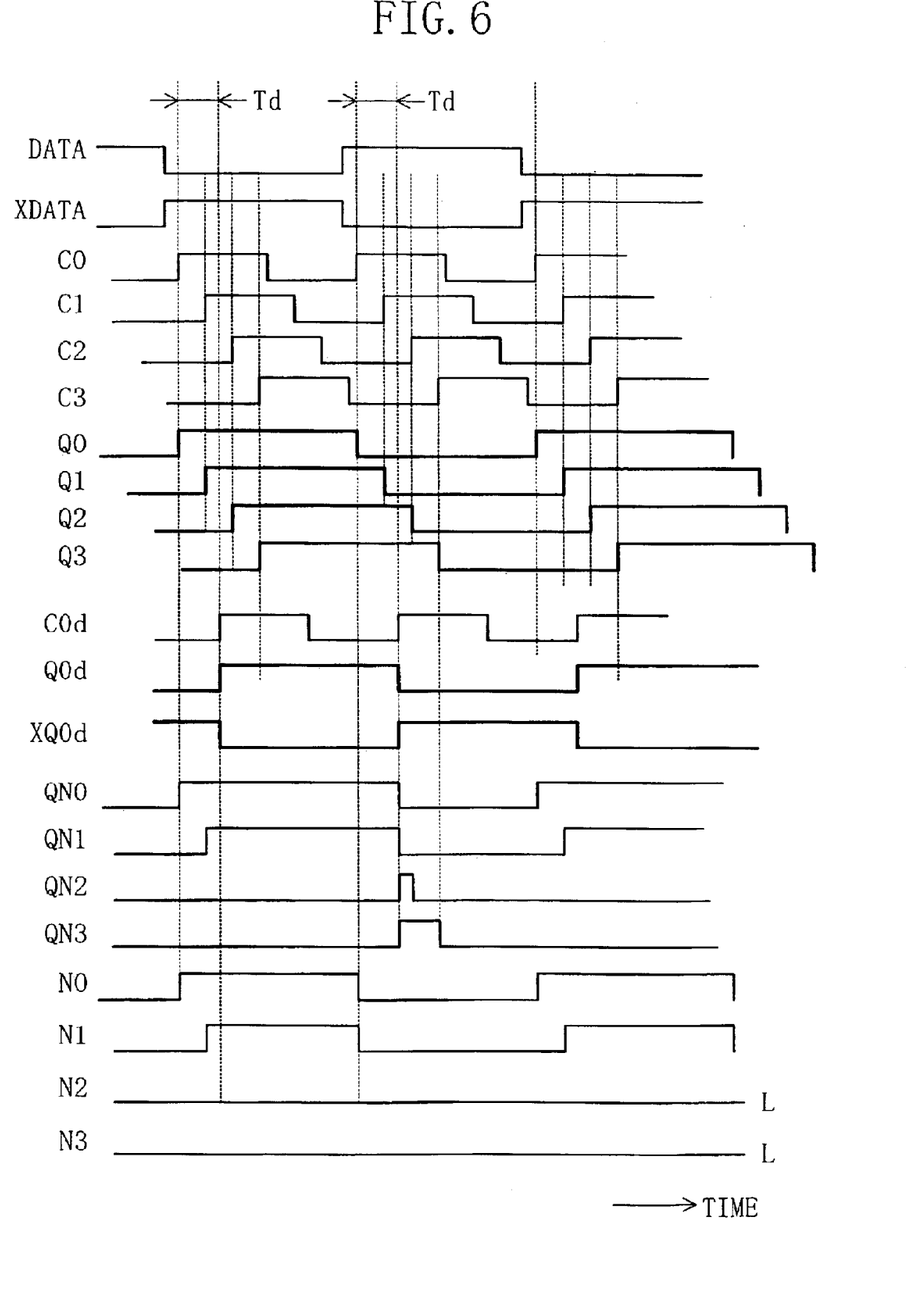
FIG. 6 is a timing flowchart showing a driving example of the N-channel output transistors in FIG. 1.
Figure 7:
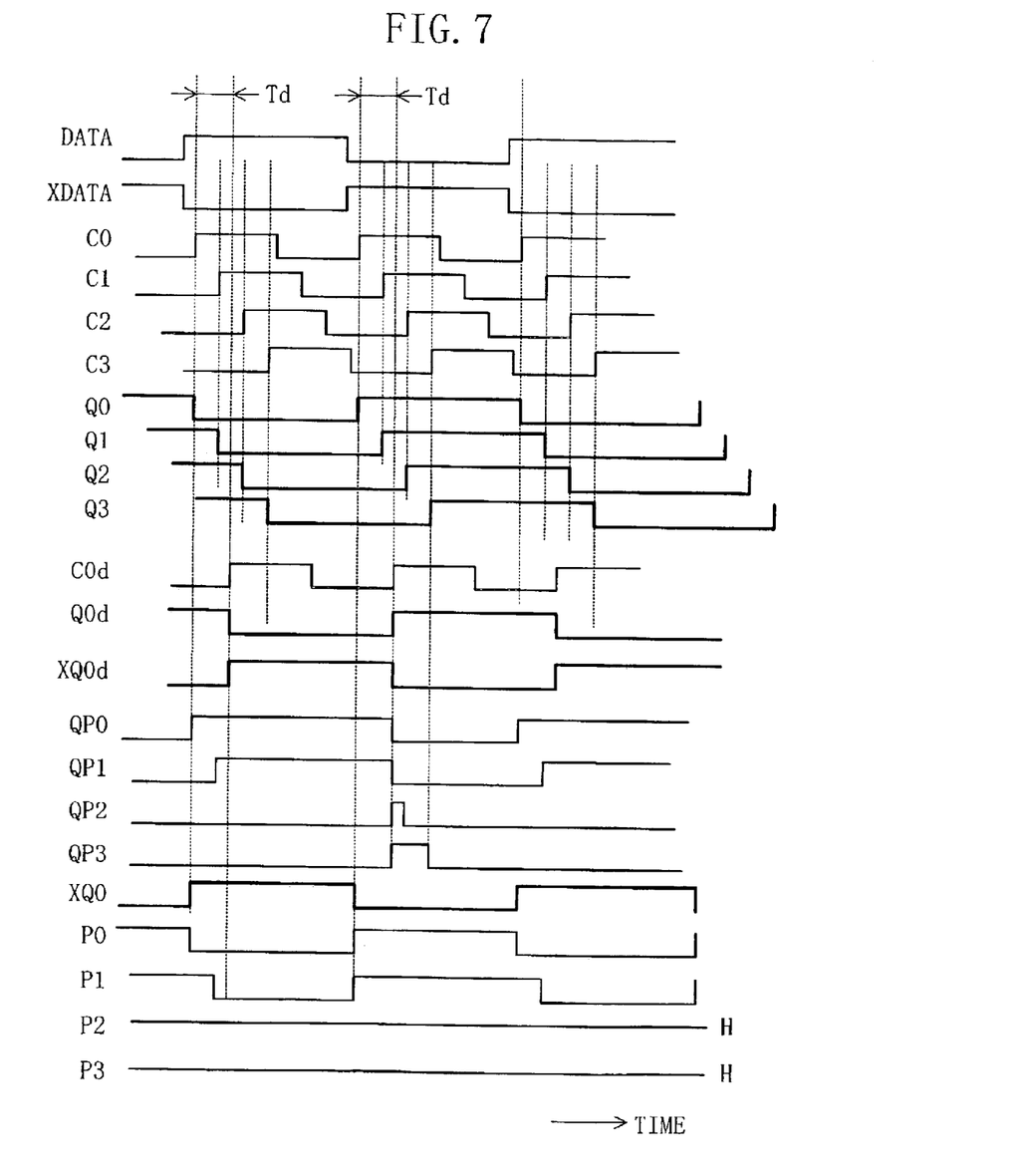
FIG. 7 is a timing flowchart showing a driving example of the P-channel output transistors in FIG. 1.

FIG. 6 shows an example in which the two N-channel output transistors 20 and 21 become conducting and FIG. 7 shows an example in which the two P-channel output transistors 24 and 25 become conducting. Here, it is assumed that the signals rise in the order of C0, C1, C0d, C2 and C3, due to the length of Td. The four D flip-flops 40, 41, 42 and 43 of the first logic circuit 13 latch the XDATA signal respectively in synchronization with the rising edges of C0, C1, C2 and C3, and the one D flip-flop 71 in the second logic circuit 14 also latches the XDATA signal in synchronization with the rising edge of C0d. Consequently, the signals rise in the order of Q0, Q1, Q0d, Q2 and Q3 and also fall in the order of Q0, Q1, Q0d, Q2 and Q3. As a result, as shown in FIG. 6, N1 rises with a delay to the rise of N0, and N0 and N1 fall simultaneously without N2 or N3 rising. Furthermore, as shown in FIG. 7, P1 falls with a delay to the fall of P0, and P0 and P1 fall simultaneously without P2 or P3 rising.

When the current driving capability of the output transistors 20 to 27 becomes low because of variations in the manufacturing process or fluctuations in the power source voltage or the temperature, the delay time Td of C0d with respect to C0 becomes longer. Therefore, the signals rise in the order of C0, C1, C2, C0d, and C3, and N2 also changes in addition to N0 and N1, or P2 also changes in addition to P0 and P1, so that the number of the output transistors 20 to 27 that become conducting increases. Thus, the number of conducting transistors increases so that the drop of the current driving capability of the individual output transistors 20 to 27 is cancelled, and as a result, the output current of the driver circuit 10 is kept substantially constant.

Conversely, when the current driving capability of the output transistors 20 to 27 becomes high, then the delay time Td of C0d with respect to C0 becomes shorter. Therefore, the signals rise in the order of C0, C0d, C1, C2, and C3, and only N0 or P0 change, so that the number of the output transistors 20 to 27 that become conducting decreases. Thus, the number of conducting transistors decreases so that the increase of the current driving capability of the individual output transistors 20 to 27 is cancelled, and as a result, the output current of the driver circuit 10 is kept substantially constant.

In this manner, the control circuit made of the first and second logic circuits 13 and 14 in FIG. 1 increases the number of the output transistors 20 to 27 that become conducting if it is detected from a change in Td that the driving capability of the individual output transistors 20 to 27 has decreased, and decreases the number of the output transistors 20 to 27 that become conducting if it is detected from a change in Td that the driving capability of the individual output transistors 20 to 27 has increased. For this purpose, the D flip-flops 40 to 43 in the first logic circuit 13 generate Q0, Q1, Q2 and Q3, and the second logic circuit 14 generates C0d and Q0d. And the data latch circuits 50 to 57, the AND circuits 60 to 63, and the NAND circuits 64 to 67 in the first logic circuit 13 are configured such that a change in the current driving capability of the output transistors 20 to 27 is detected from the phase relation between Q0, Q1, Q2, Q3 and Q0d. It should be noted that the first and the second logic circuits 13 and 14 also detect a change in the current driving capability of the output transistors 20 to 27 from the phase relation between C0, C1, C2, C3 and C0d.

The configuration in FIG. 1 utilizes the fact that C0, C1, C2 and C3 each have a different phase difference to CLK, so that by letting N1 rise at a delay with respect to N0, as shown for example in FIG. 6, the conduction timings of the N-channel transistors 20 and 21 are offset from one another. Also, by letting P1 rise at a delay with respect to P0, as shown for example in FIG. 7, the conduction timings of the P-channel transistors 24 and 25 are offset from one another. Thus, by offsetting the conduction timings of the output transistors 20 to 27 from one another in this manner, it is further possible to attain the result that noise during data output can be suppressed.

It should be noted that the number of N-channel output transistors and P-channel output transistors in the driver circuit 10 is not limited to four each. When the number of output transistors is not four, then the number of phases of the multi-phase clock signals should be adjusted accordingly.

Figure 8:
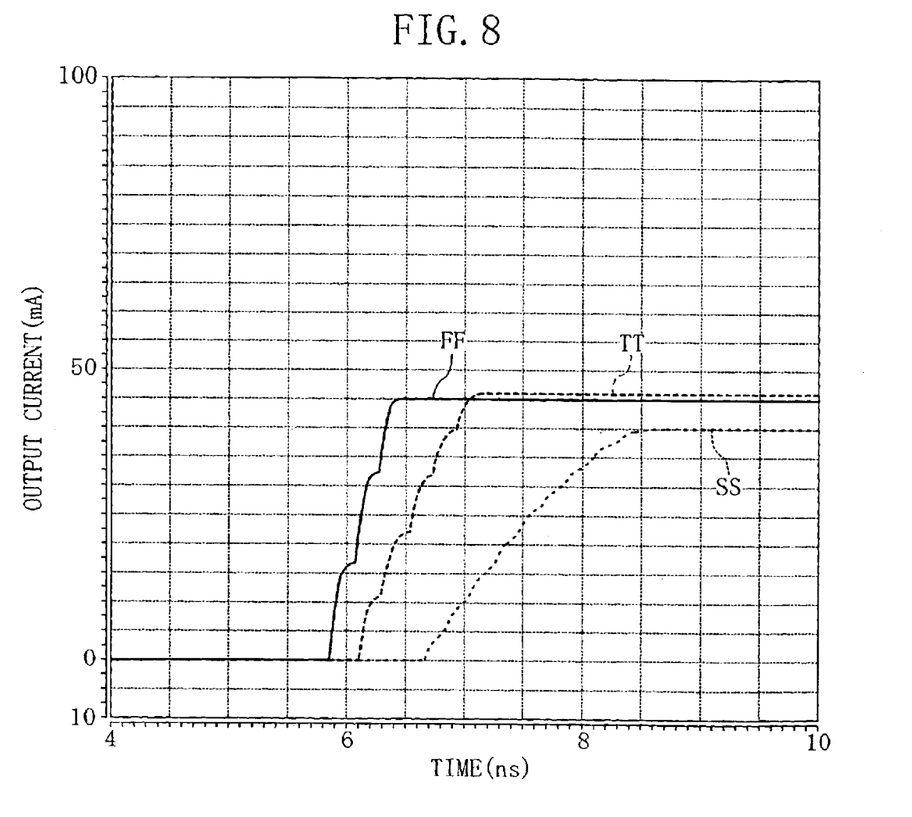
FIG. 8 is a waveform chart for an output current simulation illustrating the effect of the output circuit in FIG. 1.

FIG. 8 shows simulated waveforms of the output current of the circuit in FIG. 1 for the case that the driver circuit 10 is configured by ten N-channel output transistors and ten P-channel output transistors. The simulation conditions are TT (standard conditions), SS (worst-case conditions) and FF (best-case conditions). From the waveforms in FIG. 8, it can be seen that in accordance with the present invention, the variations of the output current can be suppressed to several percent.

Figure 9:
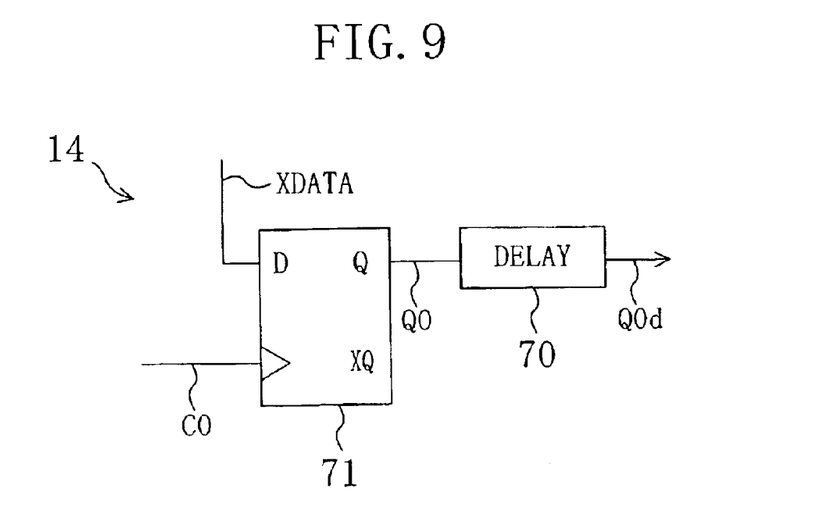
FIG. 9 is a block diagram showing a modified example of the second logic circuit in FIG. 1.

FIG. 9 shows a modified example of the second logic circuit 14 in FIG. 1. In this modified example, the delay circuit 70 is arranged in the stage following the D flip-flop 71. In FIG. 9, the D flip-flop 71 receivers XDATA at its D terminal and C0 at its clock terminal, and supplies the data signal Q0 from its Q terminal. The data signal Q0 is a signal that has the same phase as one of the four-phase data signals Q0, Q1, Q2 and Q3 in the first logic circuit 13 in FIG. 1. The delay circuit 70 in this modified example supplies a delay fluctuation data signal Q0d, which is obtained by delaying Q0 by the variable delay time Td. This delay fluctuation data signal Q0d is a signal that has the same phase as Q0d supplied by the second logic circuit 14 in FIG. 1. Consequently, also with this modified example, changes in the current driving capability of the output transistors 20 to 27 can be detected from the phase relation of Q0, Q1, Q2, Q3 and Q0d, and the output current of the driver circuit 10 is kept substantially constant.

It should be noted that it is also possible to let the N-channel output transistors 20 to 23 in FIG. 1 be of different sizes. Similarly, also the size of the P-channel output transistors 24 to 27 may be varied. Also, the inverter 31 has been added in order to match the polarity of the DATA signal with that of the output pad 11, but it is also possible to omit the inverter 31. Furthermore, the applicability of the present invention is not limited to output circuits having a CMOS driver circuit. For example, it is also possible to apply the present invention to output circuits having a driver circuit having only N-channel output transistors or only P-channel output transistors.

Furthermore, the phase difference of the multi-phase clock signals C0, C1, C2 and C3 with respect to CLK does not have to be the same interval. The clock signal supplied to the second logic circuit 14 is not limited to C0, which is one of C0, C1, C2 and C3, and may also be a clock signal that is different from C0, C1, C2 and C3. As long as the length of the delay time Td of the circuit 70 is adjusted, it is possible to supply, for example, FCLK in FIG. 4 to the second logic circuit 14. Moreover, even when the phase difference of C0, C1, C2 and C3 with respect to CLK changes depending on variations in the manufacturing process, or fluctuations in the power source voltage or temperature, then, as long as the dependency of Td is greater than that dependency, it is also possible to utilize such multi-phase clock signals.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An output circuit in a semiconductor integrated circuit, comprising:

a driver circuit having a plurality of output transistors that are connected to one another in parallel; and a control circuit controlling the driver circuit such that when a given data signal indicates a predetermined logic level, at least one of the plurality of output transistors becomes conducting;

wherein the control circuit comprises a delay circuit with a variable delay time that reflects a change of a current driving capability of each of the plurality of output transistors, said control circuit controlling the number of output transistors that are conducting based at least in part on the delay time.

2. The output circuit according to claim 1, wherein the delay time of the delay circuit becomes longer as the current driving capability of the output transistors decreases, and shorter as the current driving capability of the output transistors increases; and wherein the control circuit increases the number of the output transistors that become conducting as the delay time becomes longer, and decreases the number of the output transistors that become conducting as the delay time becomes shorter.

3. The output circuit according to claim 1, wherein the control circuit comprises:

a means for receiving multi-phase clock signals, each having a different phase difference with respect to a reference clock signal;

a means for generating, with the delay circuit, a delay fluctuation clock signal having a variable phase difference that reflects the delay time with respect to the reference clock signal; and a means for determining a phase relation between the multi-phase clock signals and the delay fluctuation clock signal and detecting a change in the current driving capability of the output transistors from that phase relation.

4. The output circuit according to claim 1, wherein the control circuit comprises:

a means for generating, from multi-phase clock signals that each have a different phase difference with respect to a reference clock signal, multi-phase data signals that each have a logic change pattern that corresponds to the data signal;

a means for generating with the delay circuit a delay fluctuation data signal having a variable phase difference that reflects the delay time with respect to the reference clock signal and having a logic change pattern that corresponds to the data signal; and a means for determining a phase relation between the multi-phase data signal and the delay fluctuation data signal and detecting a change in the current driving capability of the output transistors from that phase relation.

5. The output circuit according to claim 1, wherein the control circuit controls the output transistors that become conducting in such a manner that conduction timings of the output transistors are offset against one another.

6. The output circuit according to claim 1, wherein, when it is detected from a change of the delay time that the current driving capability of the individual output transistors has decreased, then the number of the output transistors that become conducting is increased; and wherein, when it is detected from a change of the delay time that the current driving capability of the individual output transistors has increased, then the number of the output transistors that become conducting is decreased.

7. The output circuit according to claim 1, wherein the delay circuit includes a plurality of transistors having at least one same characteristic as the plurality of output transistors.

8. The output circuit according to claim 1, wherein the control circuit operates so that an output current of the driver circuit is kept substantially constant for a given data signal.

9. An output circuit in a semiconductor integrated circuit, comprising:

a driver circuit having a plurality of output transistors that are connected to one another in parallel; and a control circuit controlling the driver circuit such that when a given data signal indicates a predetermined logic level, at least one of the plurality of output transistors becomes conducting;

wherein the control circuit comprises a delay circuit with a variable delay time that reflects a change of a current driving capability of the plurality of output transistors independently of an output current of the driver circuit, said control circuit controlling the number of output transistors that are conducting based at least in part on the delay time.

* * * * *